(12) United States Patent
Kounosu et al.

(10) Patent No.: US 8,041,519 B2
(45) Date of Patent: Oct. 18, 2011

(54) METHOD TO PRODUCE AN OPTICAL MODULE FOR ANALOG DATA TRANSMISSION

(75) Inventors: Takashi Kounosu, Yokohama (JP); Satoshi Yoshimura, Yokohama (JP); Shin Satoh, Yokohama (JP); Masaki Furumai, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 356 days.

(21) Appl. No.: 12/232,758

(22) Filed: Sep. 23, 2008

(65) Prior Publication Data

US 2009/0099797 A1    Apr. 16, 2009

(30) Foreign Application Priority Data

Sep. 27, 2007 (JP) ................................. 2007-252098

(51) Int. Cl.
*G01R 15/00* (2006.01)

(52) U.S. Cl. ........................................................ 702/57
(58) Field of Classification Search ..................... 702/57
See application file for complete search history.

(56) References Cited

U.S. PATENT DOCUMENTS 5,802,096 A    9/1998  Okuda
6,522,460 B2 *  2/2003  Bonnedal et al. ........ 359/341.42

\* cited by examiner

*Primary Examiner* — Tung S Lau
(74) *Attorney, Agent, or Firm* — Smith, Gambrell & Russell, LLP

(57) ABSTRACT

A method to produce an optical module, in particular, a module to transmit an analog data to enhance a yield thereof is disclosed. The method comprises (a) taking an I-L characteristic and its slope efficiency, (b) taking a gradient of a linear approximation between the slope efficiency and a current applied to an LD, and (c) taking an optimum current for the CSO characteristic as varying the current. Steps (a) to (c) give a correlation between the gradient of the linear approximation and the optimum current and are performed in advance to the practical production.

1 Claim, 9 Drawing Sheets

METHOD TO PRODUCE AN OPTICAL MODULE FOR ANALOG DATA TRANSMISSION

BACKGROUND OF THE INVENTION

1. Field of the Invention

The present invention relates to a method to produce an optical module that installs a distributed feedback laser diode (hereafter denoted as DFB-LD), in particular, the optical module produced by the present method is utilized for the optical transmission of an analog data.

2. Related Prior Art

The United States patent, the U.S. Pat. No. 5,802,096, has disclosed a method to manufacture an optical module for the analog data transmission. The method disclosed therein inspects the composite second order beat (hereafter denoted as CSO) of the DFB-LD after a laser chip is installed within the module package.

In the DFB-LD, in particular, that is applied in the analog transmission, the CSO performance thereof influences the transmission system. The CSO performance of the DFB-LD strongly depends on the inner structure of the DFB-LD device. Accordingly, in a case where the CSO performance is inspected after the DFB-LD device is installed within the module housing, the yield becomes hard to be kept in an acceptable level.

SUMMARY OF THE INVENTION

One aspect of the present invention relates to a method to manufacture an optical module primarily used in an analog data transmission system. The optical module includes a DFB-LD chip therein, which is a target semiconductor chip and installed by a method including steps of: (a) randomly selecting a plurality of DFB-LD chips from a production unit of the DFB-LD chips, (b) calculating a gradient of a linear approximation between a slope efficiency and a driving current for the selected chips, (c) evaluating an optimum driving current with respect to the CSO characteristic for the selected chips, (d) taking a correlation between the gradient and the optimum driving current by iterating the steps (b) and (c) for respective DFB-LD chips, and (e) determining a driving current supplied to the target chip, which is not selected in the selection step (a) and is practically installed within the module, by taking the gradient of the linear approximation for the target chip.

In the DFB-LDs, the CSO characteristic of the DFB-LD shows a strong correlation with respect to the gradient of the linear approximation between the slope efficiency and the driving current, which was firstly found by the inventors. Therefore, the optical module with DFB-LD for the analog data transmission may determine the optimum operating condition thereof only by taking the gradient of the linear approximation between the slope efficiency and the driving current applied thereto.

Moreover, the gradient above may be taken for the DFB-LD chip before it is practically assembled within the module housing. Accordingly, the manufacturing process of the invention makes it possible to estimate the performance of the DFB-LD, in particular the performance for the analog signal such as the CSO characteristic, before practically assembled within the housing, which drastically enhances the yield of the module. Conventionally, the performance of the DFB-LD for the analog signal is only obtainable in the packaged form. Therefore, even a failure or lack of the performance was found, whole components including the housing and so on had to be discarded.

On the other hand, according to the method of the present invention, a DFB-LD chip with a required performance may be selectively assembled in the optical module, which may drastically enhance the yield. Moreover, because the optimum driving current to minimize the CSO may be come to know before assembling only by taking the gradient of the linear application, an optimum DFB-LD chip may be selected depending on the optimum driving current thereof and the application of the module. When the application requests an optical module with high optical output power, a DFB-LD chip with a larger optimum driving current may be selected.

These and other objects, features, aspects and advantages of the present invention will become more apparent from the following description of the present invention when taken in conjunction with the accompanying drawings.

DESCRIPTION OF PREFERRED EMBODIMENTS

Next, preferred embodiments according to the present invention will be described as referring to accompanying drawings. In the description of the drawings, the same numerals or the symbols will refer to the same elements without overlapping explanations.

Figure 1:
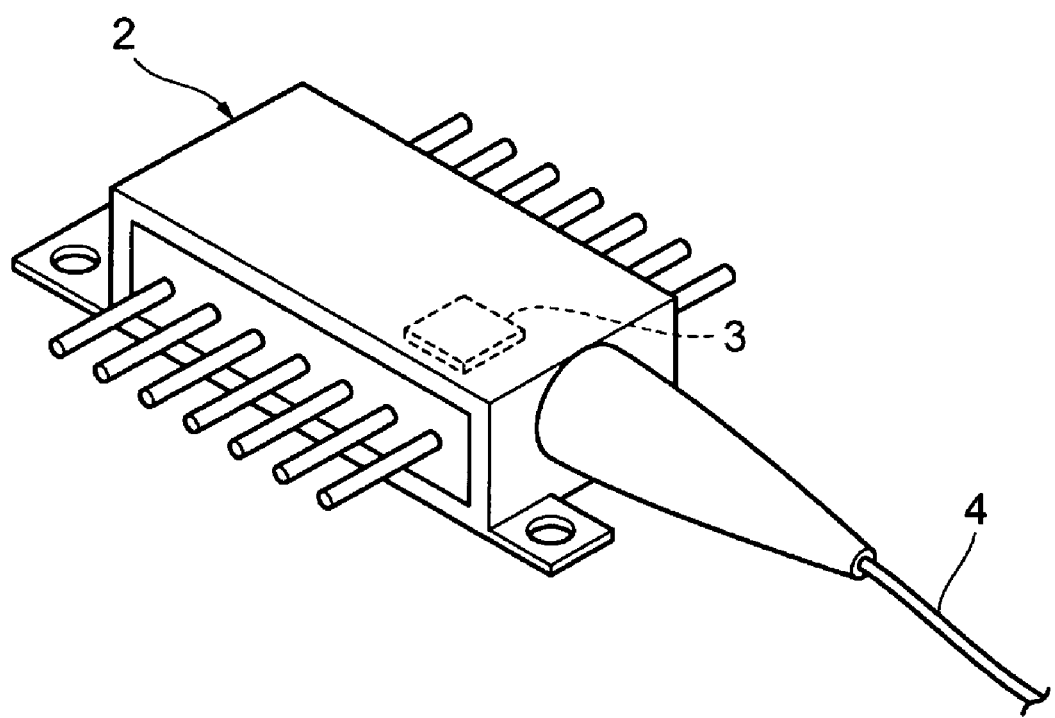
FIG. 1 illustrates an external appearance of an optical module produced by the process according to the embodiment of the invention.

FIG. 1 schematically illustrates an external appearance of an optical module produced by a method of the present invention. This optical module may be applicable to, for example, the CATV (Cable Television) communication system, in particular, to the downward transmission from the head end station to the subscribers. The module 1 installs a distributed feedback laser diode (DFB-LD) 3 in a chipped shape within a housing 2. In FIG. 1, the housing has, what is called, the butterfly package. The DFB-LD chip optically couples with the optical fiber 4. Although not explicitly illustrated in FIG. 1, the optical module 1 may install some optical components such as an optical isolator, a lens and so on, and some electrical components within the housing 2.

Figure 2:
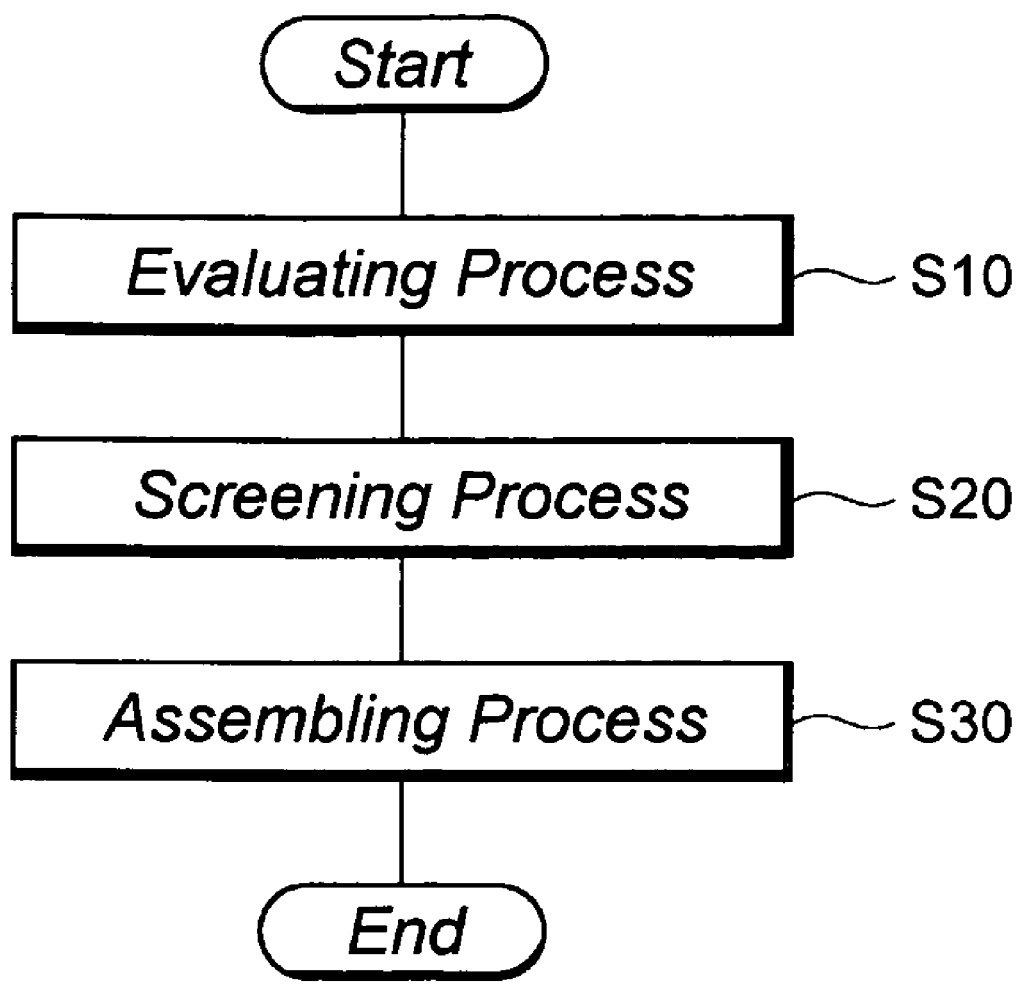
FIG. 2 shows a flow chart of the process of the present invention.

For the production of the optical module 1, FIG. 2 schematically shows a flowchart to produce the module. First, the composite second order beat (hereafter denoted as CSO) is taken for randomly selected DFB-LDs in step S10, the evaluation step, in advance to the practical production of the module. Subsequently, an optimum driving current at which the CSO becomes the minimum is determined based on the taken characteristic of the CSO for the DFB-LD chip 3 practically assembled within the module at step S20, the screening process. Finally, the DFB-LD chip, the driving current of which is thus determined, is mounted within the module housing 2 so as to emit light with a preset output power by the optimum driving current at step S30, the assembling process.

Figure 3:
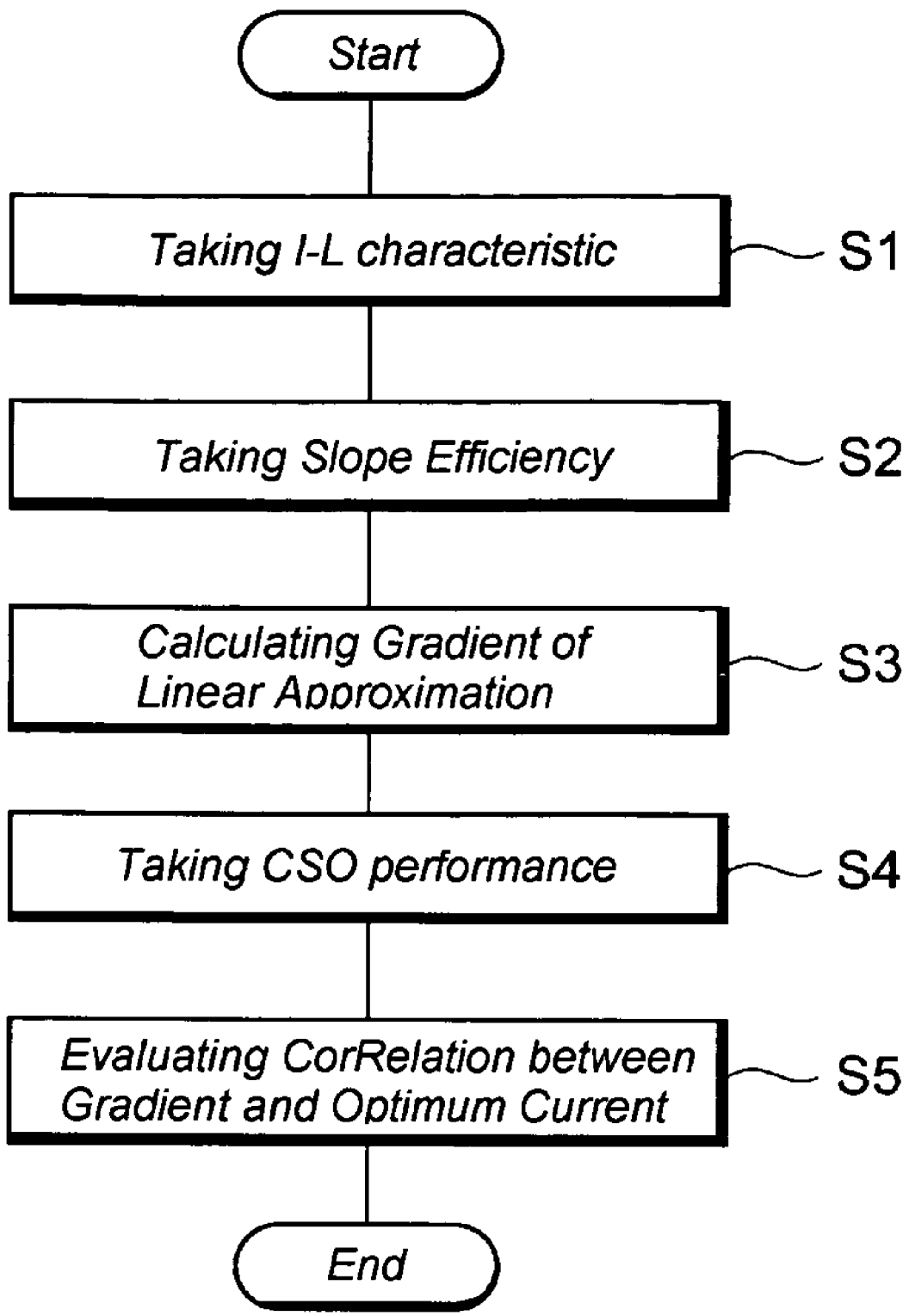
FIG. 3 is a flowchart breaking up the evaluating step shown in FIG. 2.

Next, the step S10 above mentioned will be described in detail as referring to FIG. 3.

First, the current vs. output power performance, which is often called as the I-L characteristic, is measured at a predetermined temperature for DFB-LD chips randomly selected from a production unit at step S1. A slope efficiency of the device under various driving currents may be evaluated from the slope of the I-L characteristic at step S2. At step S3, the slope of this slope efficiency with respect to the driving current may be calculated in a region where the driving current is greater than a certain value.

Figure 4:
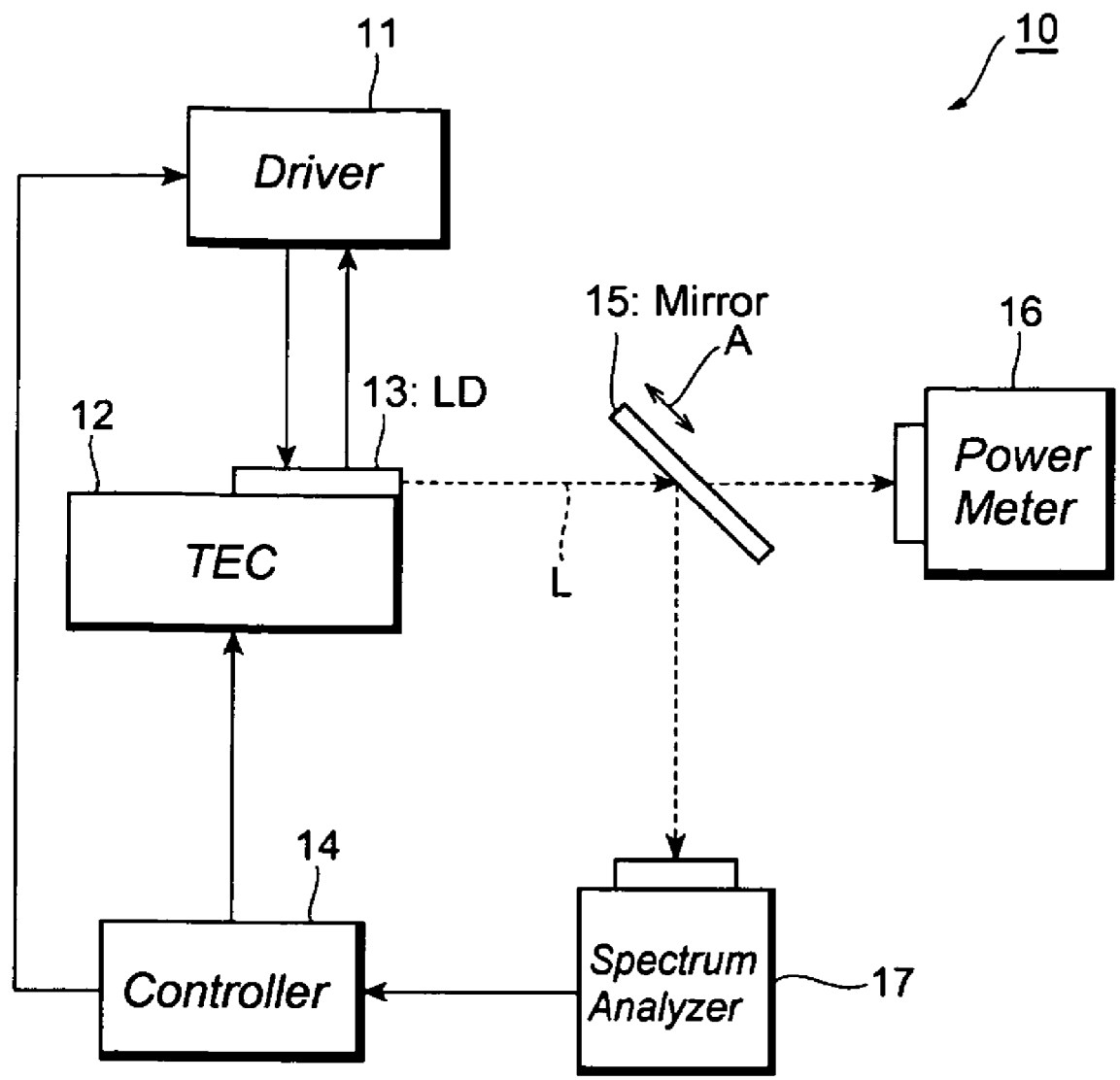
FIG. 4 schematically illustrates a setup to measure the I-L characteristic of the LD chip.

FIG. 4 schematically illustrates a setup 10 to measure the I-L characteristic. The setup 10 comprises a cooler 12, a driver 11, a controller 14, a half mirror 15, a spectrum analyzer 17 and an optical power meter 16. The cooler 12, which is often called as Thermoelectric Cooler (hereafter denoted as TEC) and includes Peltier elements therein, may control a temperature of the LD 13 mounted thereon. The spectrum analyzer 17 monitors an optical spectrum of the light emitted from the LD 13. The controller 14, typically a computer, controls not only the temperature of the LD 13 by operating the TEC 12 but the driver 11 to adjust the driving current. The power meter 16, typically a photodiode is used, detects the output power of the LD 13. The half mirror 15, which is movable along the direction A, changes the optical path from the LD 13 to that heading for the power meter 16 or for the spectrum analyzer 17.

Setting an LD chip 13 selected from a production unit on the TEC 12, whereby the temperature of the LD chip 13 is kept substantially constant at a room temperature, for instance 25° C., and adjusting the driving current supplied to the LD chip 13 from the driver 11 by the controller 14, the power meter 16 detects the magnitude of the light L output from the LD 13. The I-L characteristic of this LD chip 13 may be obtained by iterating the measurement above described as varying the driving current.

Figure 5:
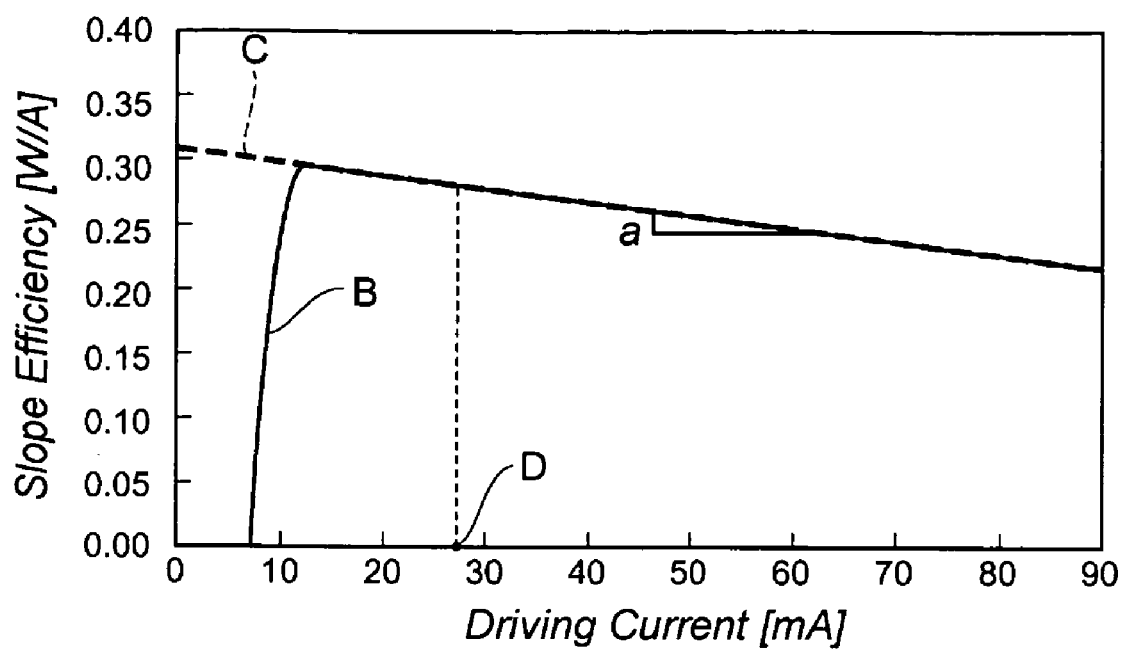
FIG. 5 is an example of the slope efficiency against the driving current and the linear approximation of their relation.

FIG. 5 shows a typical example of a relation between the slope efficiency and the driving current for the LD chip. A solid line B in the figure corresponds to the slope efficiency, while, a broken line C is a linear approximation of the slope efficiency B in a range over a certain driving current. The slope efficiency B may be approximated in linear to show a line C in a range over the certain driving current D. Thus, the gradient "a" of the linear approximation C may be obtained. The critical driving current D is so set that the current D is 20 mA larger than a driving current at which the slope efficiency steeply increases, which is nearly equal to the threshold current of the LD.

Next, the CSO characteristic of the LD 13 with respect to the driving current is measured at the temperature.

Figure 6:
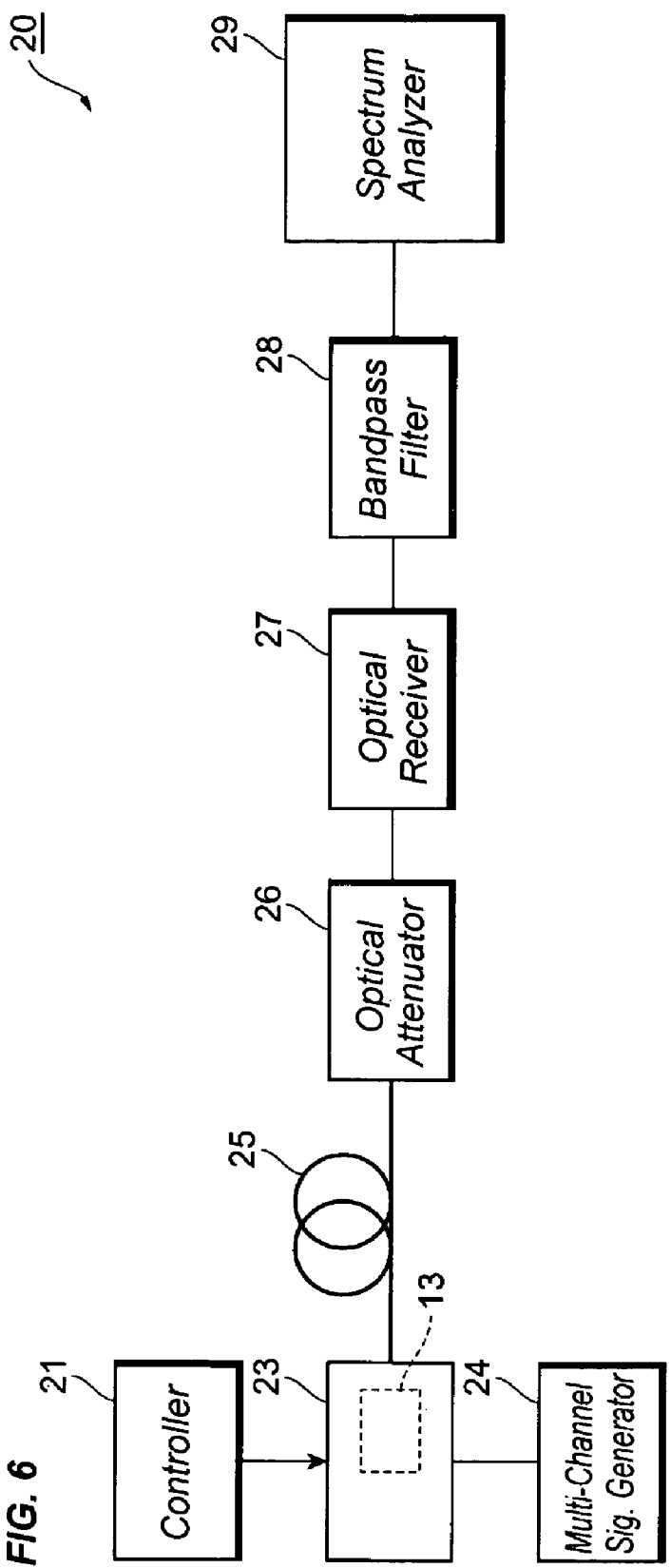
FIG. 6 schematically illustrates a setup to measure the CSO.

FIG. 6 schematically illustrates an example of the setup 20 to measure the CSO characteristic. The system 20, by using an optical module 23 that installs the LD chip 13, includes a controller 21 and a multi-channel signal generator 24. The controller controls the temperature of the module 23 and the driving current applied to the LD 13. The multi-channel signal generator 24 generates a plurality of modulation signals, for instance, the generator 24 generates high frequency signals in a range from 50 to 770 MHz, which enters the optical module 23.

Concurrently with the application of the high frequency signals to the module 23, the controller keeps the temperature of the LD, for instance, at the room temperature 25° C., and adjusts the driving current of the LD 13. The light thus generated passes the optical attenuator 26 through the single mode fiber 25, and reaches the optical receiver 27. An electrical signal corresponding to the light emitted from the module 23 is analyzed in frequencies thereof by the spectrum analyzer 29 after passing the band-pass filter 28. Thus, the CSO characteristic may be obtained. By obtaining the CSO characteristic as varying the driving current, the CSO performance of the LD chip 23 in the module 23 may be evaluated.

Figure 7:
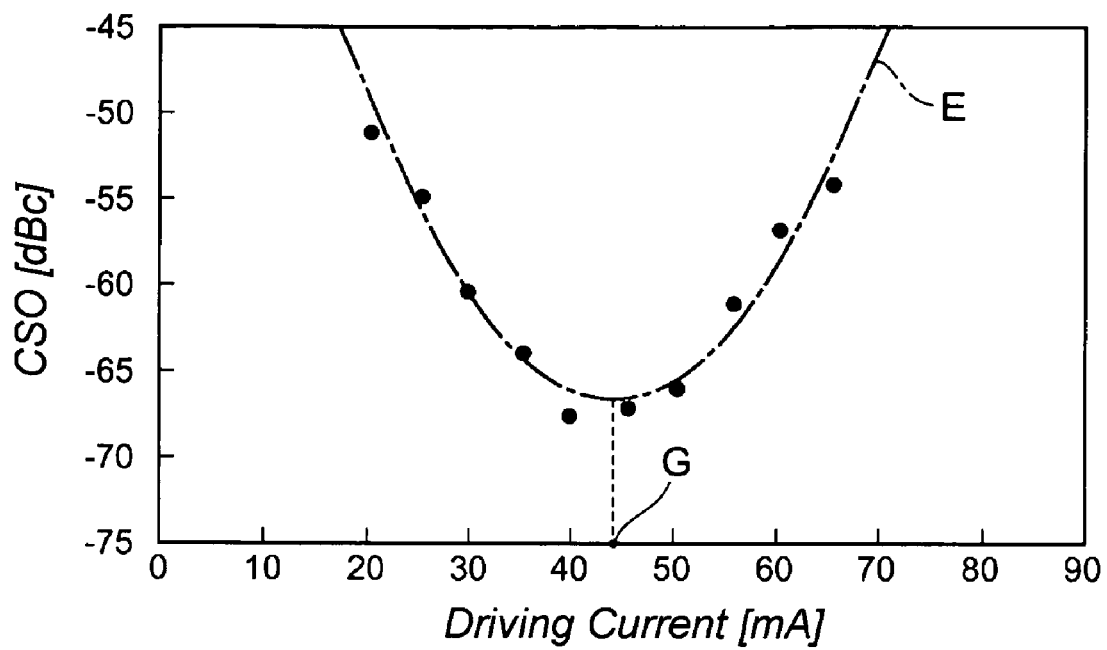
FIG. 7 is an example of the CSO performance of the LD chip measured by the setup shown in FIG. 6.

FIG. 7 shows a typical example of the CSO performance measured by the setup shown in FIG. 6. Respective dots in the figure correspond to values practically obtained, while, a doted line E denotes the CSO performance of the LD chip. The vertical axis is converted to a ratio of the CSO against the amplitude of the fundamental frequency, namely, the carrier frequency in the unit of dBc. As shown in FIG. 7, the behavior E may be approximated with a quadratic curve. The minimum of this quadratic curve gives a driving current to set the CSO minimum. Accordingly, we can obtain an optimum driving current G.

The method according to the present invention iterates steps from S1 to S4 for respective LD chips randomly selected from the production unit. By relating the gradient "a" of the linear approximation of the slope efficiency with the optimum driving current, we can correlate the slope with the optimum driving current in step S5.

Figure 8:
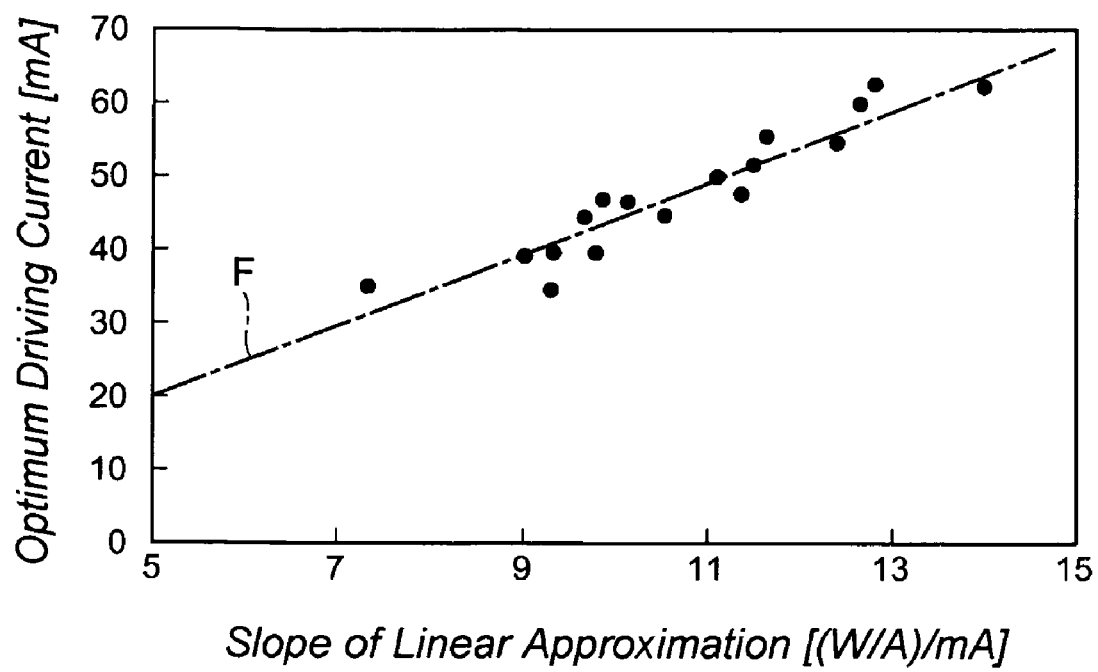
FIG. 8 indicates a correlation between the optimum driving current and the gradient of the linear approximation of the slope efficiency with respect to the driving current.

FIG. 8 shows the relation of the optimum driving current to the gradient "a" obtained in the procedure described above. Dots in the figure correspond to practical results for respective LD chips. A behavior F, denoted as a chain line, corresponds to the correlation of the optimum driving current with the slope of the linear approximation, which gives a linear correlation.

Figure 9:
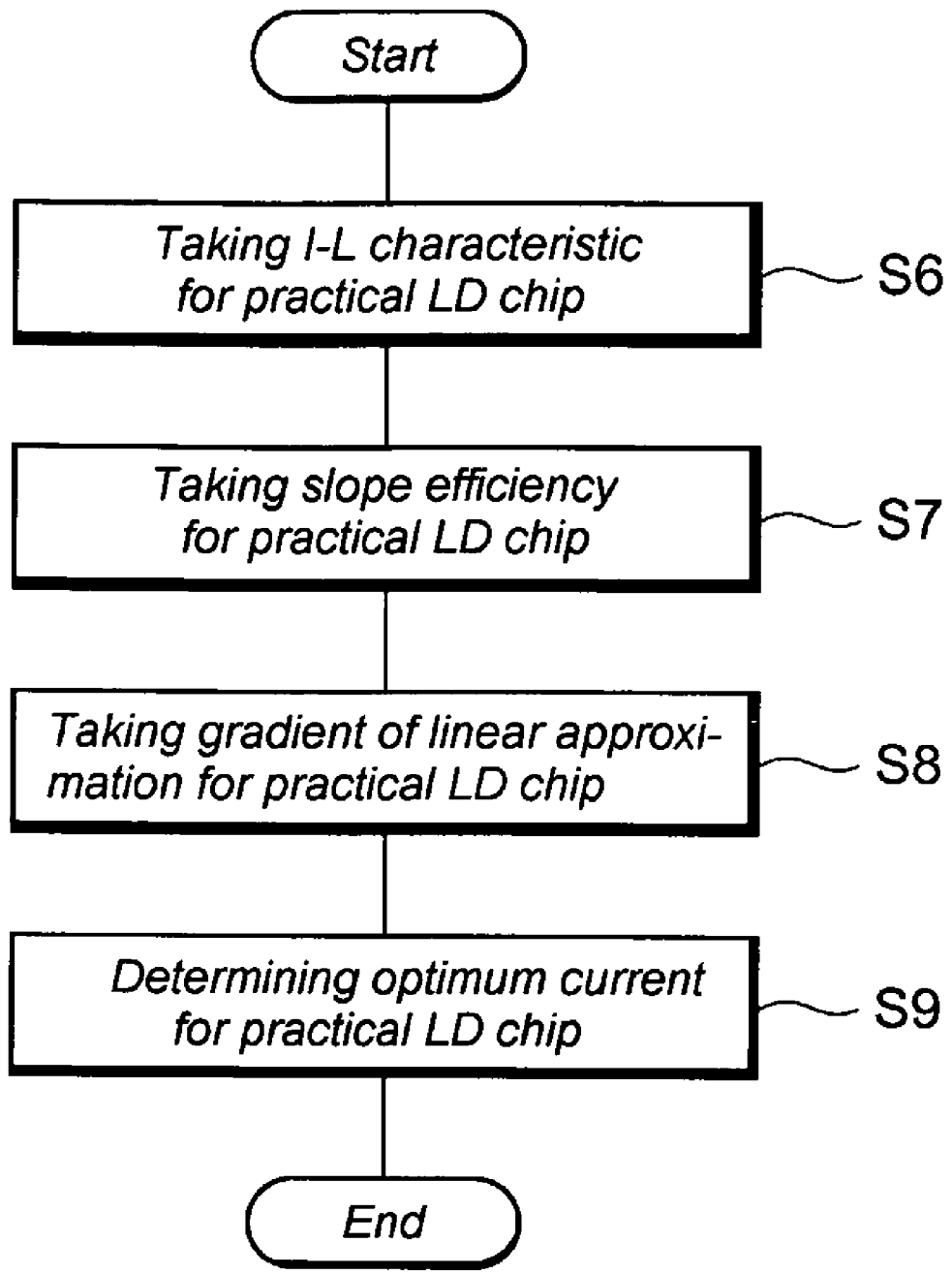
FIG. 9 is a flowchart breaking up the screening step shown in FIG. 2.

Next, the screening step shown in FIG. 2 will be explained as referring to FIG. 9.

First, the method of the invention measures at the room temperature the I-L characteristic at step s6 for all LD chips 3, which are not selected in the evaluating step s10, and calculates the slope efficiencies in step S7 and the gradient "a" of the linear approximation in a range of the driving current greater than the critical current in step S8. The steps S6 to S8 are the same as those explained in steps S2 and S3.

The optimum driving current for respective target LD chips 3 may be estimated in step S9 from the correlation F obtained in step 10. That is, the optimum driving current may be determined from the correlation F between the current and the gradient of the linear approximation without practically measuring the CSO characteristic of the LD chips.

According to the method described above, it is able to select an LD chip with a relatively small optimum driving current for an optical module necessary less output power, while another LD chip with a larger optimum driving current may be applied to a module that is necessary to output light with a greater power. That is, the optical modules with specific optical powers may select an optimum LD chip with respect to the CSO performance, which may enhance a yield of the optical module.

Moreover, in a case where the driving current of the optical module 1 is defined as one of the specifications, the method of the invention may select an LD chip whose optimum current coincides with this specified driving current. That is, we can derive a gradient "a" corresponding to the specified driving current from the correlation F shown in FIG. 8, and by selecting an LD chip 3 showing such a gradient "a", we can assemble an optical module showing the best performance with respect to the CSO at the specified driving current.

In addition, the measurement of the CSO characteristic for the LD chip is necessary to arrange various equipments as shown in FIG. 6. Such equipments, in particular, in a case when the equipments is applicable to the bare-chip, are often expensive, and an alignment between the bare chip and the optical fiber is necessary for every chips, which excessively increases the working hours. Inevitably, the measurement of the CSO characteristic must be carried out for the optical module after assembling the LD chip in the module. The present method enables to determine the optimum driving current of the LD chip before the assembling of the optical module. Moreover, the method of the invention may omit the screening of the module by the CSO performance.

Evaluating the yield of the optical module built by the method of the present invention and that built following a conventional method, the latter method results in the yield of 60%, while, the present method attains the yield of 99%, which confirms that the method according to the present invention may enhance the yield of the optical module.

While the preferred embodiments of the present invention have been described in detail above, many changes to these embodiments may be made without departing from the true scope and teachings of the present invention. For example, the embodiment performs the step S4 to measure the CSO performance after carrying out steps S1 to S3 to get the gradient "a" of the slope efficiency. However, these two steps above may be carried out independently and the steps S1 to S3 are able to be done after or concurrently with the step S4. The present invention, therefore, is limited only as claimed below and the equivalents thereof.

We claim:

1. A method to produce an optical module able to output an optical signal with preset power for an analog data transmission, said optical module having a package to install a semiconductor chip of a DFB-LD, said method comprising steps of:

randomly selecting a plurality of DFB-LD chips from a production unit of said DFB-LD;

measuring a linear approximation of a slope efficiency against driving currents for respective DFB-LD chips selected in said selecting step;

assembling said DFB-LD within respective housing;

measuring an optimum driving current against a CSO characteristic of said DFB-LD assembled with said package, where said optimum driving current minimizes said CSO characteristic;

determining a correlation between said linear approximations of said slope efficiency and said optimum driving current;

selecting one semiconductor chip of said DFB-LD among semiconductor chips that are unselected in said randomly selecting step, said one semiconductor chip of said DFB-LD having a slope efficiency corresponding to said preset power through said correlation between said optimum driving current and said linear approximation of said slope efficiency; and assembling said one semiconductor chip of said DFB-LD selected in said selecting step in a package, evaluating a correlation between an optimum driving current with respect to a CSO characteristic and a gradient of a linear approximation of a slope efficiency with respect to a driving current for a plurality of DFB-LD chips selected from a production unit;

screening a target chip of said DFB-LD included in said production unit but unselected in said evaluating step based on said correlation; and assembling said target chip screened in said screening step within said optical module.

* * * * *